(12) United States Patent
Armschat et al.

(10) Patent No.: US 11,506,724 B2
(45) Date of Patent: Nov. 22, 2022

(54) METHOD OF MONITORING A CAPACITOR BANK FOR FAILURES

(71) Applicant: Siemens Aktiengesellschaft, Munich (DE)

(72) Inventors: Christoph Armschat, Erlangen (DE); Sergio Yamazaki, Guarulhos (BR)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 17/056,088

(22) PCT Filed: May 17, 2018

(86) PCT No.: PCT/EP2018/062917
§ 371 (c)(1),
(2) Date: Nov. 17, 2020

(87) PCT Pub. No.: WO2019/219197
PCT Pub. Date: Nov. 21, 2019

(65) Prior Publication Data
US 2021/0208211 A1    Jul. 8, 2021

(51) Int. Cl.
*H02H 7/16*     (2006.01)
*G01R 31/64*    (2020.01)

(52) U.S. Cl.
CPC ............... *G01R 31/64* (2020.01); *H02H 7/16* (2013.01)

(58) Field of Classification Search
CPC . G01R 31/64; H01G 2/16; H01G 4/38; H01G 4/40; H01G 11/16; H02H 7/16
See application file for complete search history.

(56) References Cited

U.S. PATENT DOCUMENTS

| | | |
|---|---|---|
| 3,755,711 A | 8/1973 | Fendt |
| 4,219,856 A | 8/1980 | Danfors et al. |
| 4,425,541 A * | 1/1984 | Burkum ............... G01R 31/50 324/548 |
| 7,990,101 B2 | 8/2011 | Hoff et al. |
| 9,893,388 B2 | 2/2018 | Thoelmann et al. |
| 10,330,725 B2 | 6/2019 | Fuckey et al. |
| 2002/0089802 A1 | 7/2002 | Beckwith |
| 2009/0231764 A1 | 9/2009 | Banting et al. |

(Continued)

FOREIGN PATENT DOCUMENTS

| | | |
|---|---|---|
| CN | 101506649 A | 8/2009 |
| CN | 103229065 A | 7/2013 |

(Continued)

*Primary Examiner* — Harry R Behm
(74) *Attorney, Agent, or Firm* — Laurence A. Greenberg; Werner H. Stemer; Ralph E. Locher

(57) ABSTRACT

A capacitor bank which has a plurality of capacitor units, in which each capacitor has a plurality of electrical capacitor elements, and the capacitor units are divided into a plurality of groups of capacitor units. The arrangement has a plurality of group monitoring units, with one of the group monitoring units associated with each group of capacitor units. At least one of the group monitoring units is configured so that it monitors the respective group of capacitor units for a failure of a capacitor element in one of the capacitor units of the group and, when such a failure of a capacitor element is detected, transmits data which describe this failure of the capacitor element to a monitoring receiver.

21 Claims, 8 Drawing Sheets

(56) References Cited

U.S. PATENT DOCUMENTS

| | | | |
|---|---|---|---|
| 2011/0241695 A1 | 10/2011 | Younsi et al. | |
| 2017/0059639 A1* | 3/2017 | Hashmi | H02H 7/16 |
| 2018/0210023 A1* | 7/2018 | Rostron | H01G 4/14 |

FOREIGN PATENT DOCUMENTS

| | | | |
|---|---|---|---|
| CN | 203275526 U | | 11/2013 |
| CN | 104205477 A | | 12/2014 |
| CN | 206370685 U | * | 8/2017 |
| CN | 108303594 A | * | 7/2018 |
| DE | 102012204958 A1 | | 10/2013 |

* cited by examiner

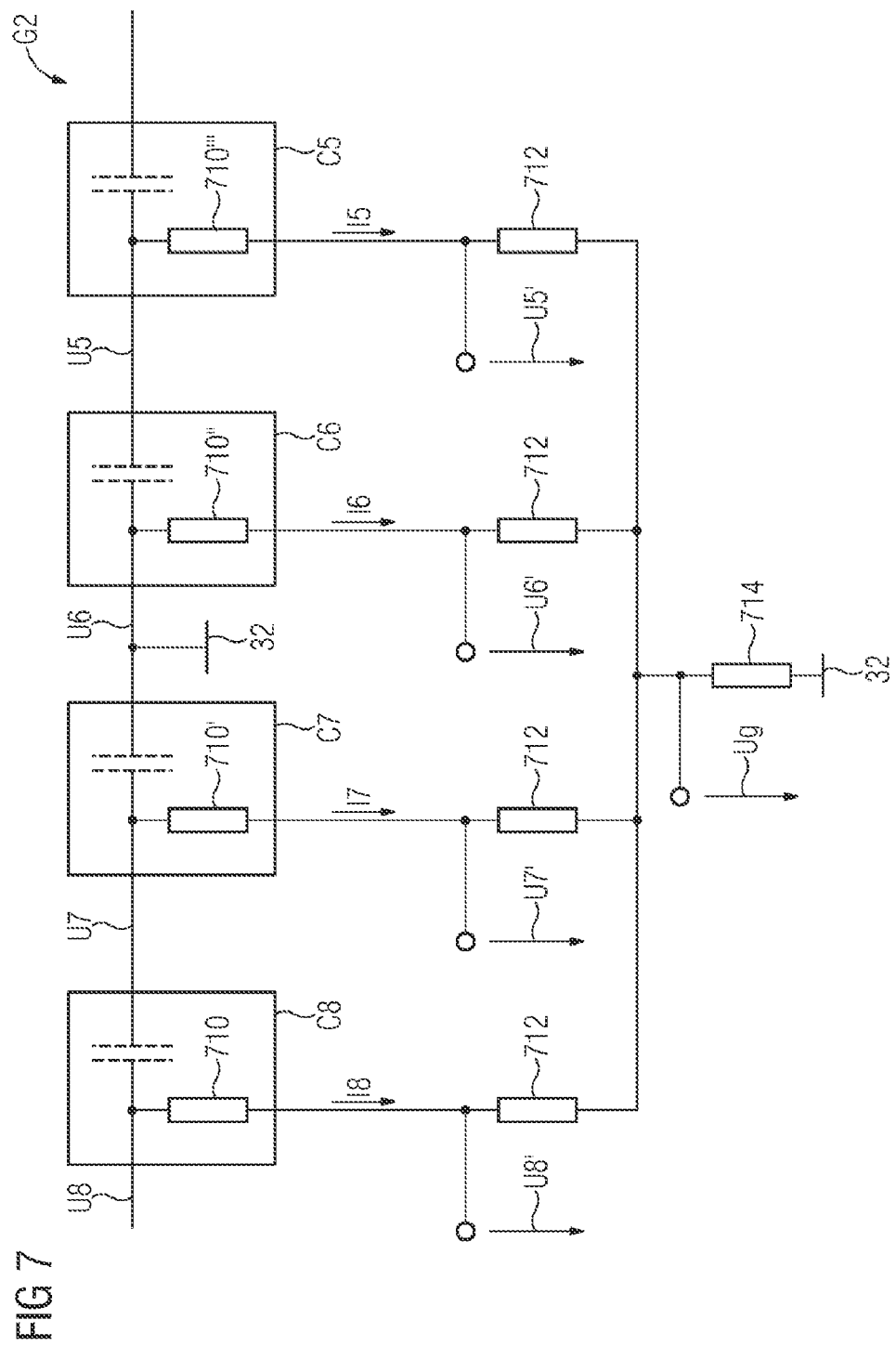

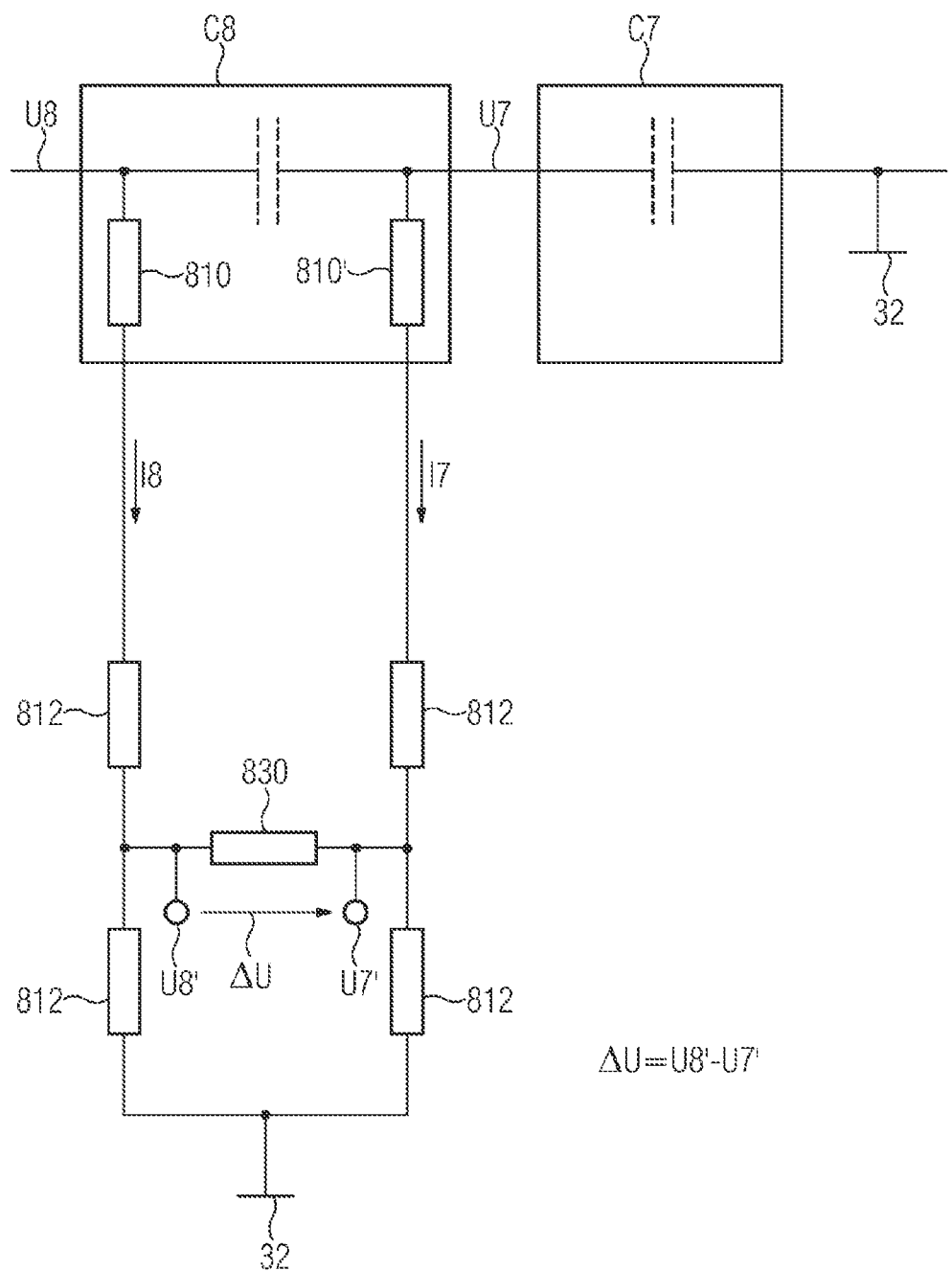

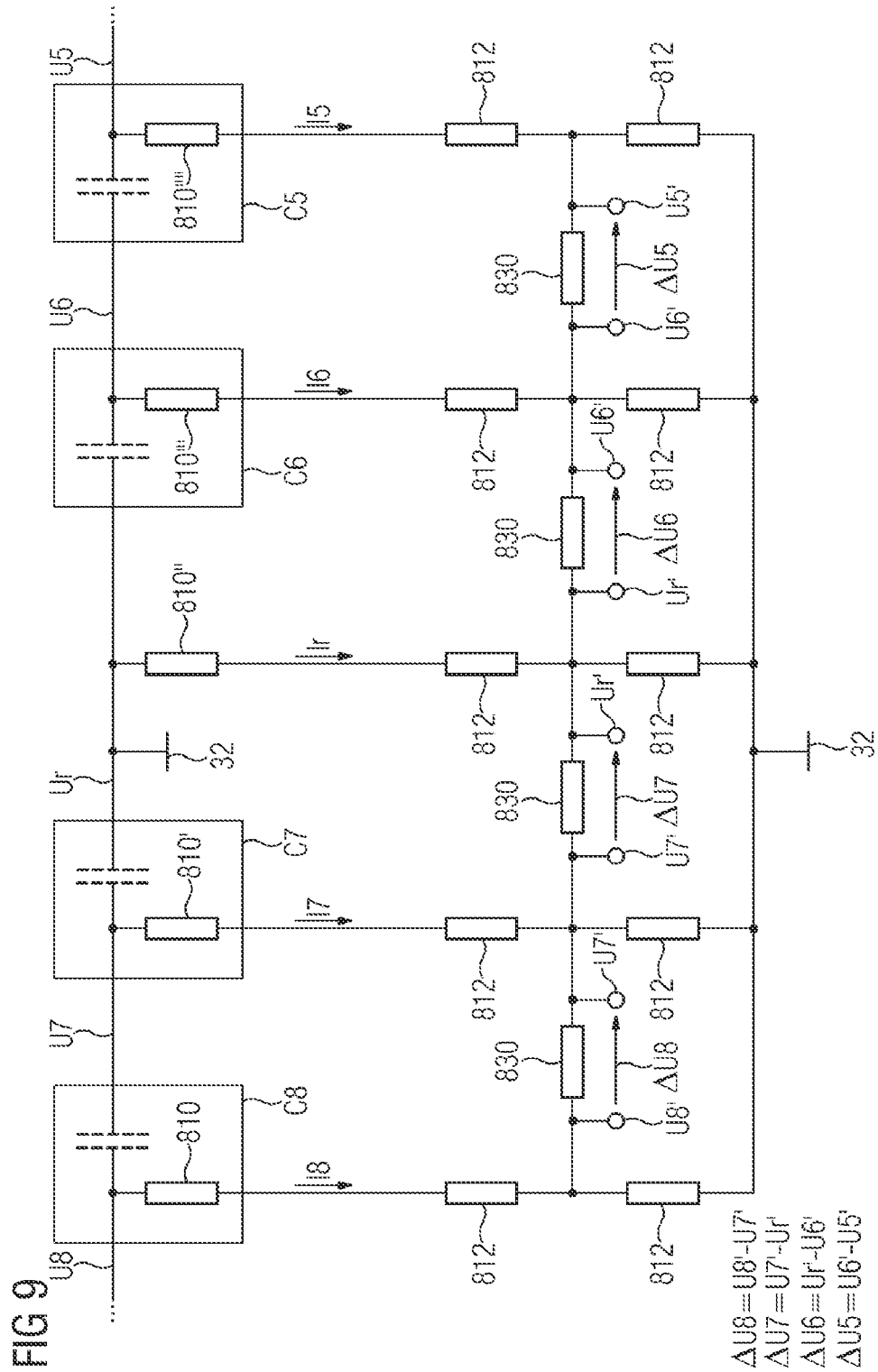

METHOD OF MONITORING A CAPACITOR BANK FOR FAILURES

BACKGROUND OF THE INVENTION

Field of the Invention

The invention relates to a capacitor bank which has a plurality of capacitor units, and also to a method for monitoring a capacitor bank of this kind.

A capacitor bank, in particular a high-voltage capacitor bank, generally has a plurality of capacitor units. In this case, the capacitor units each have a plurality of electrical capacitor elements which are configured, for example, as so-called capacitor windings. By way of example, a capacitor bank can have 300 capacitor units, wherein each capacitor unit has, for example, 70 capacitor elements.

When an individual capacitor element fails (for example on account of a flashover of the capacitor element or a short circuit in the capacitor element), the capacitance of the capacitor unit then changes only slightly owing to this failure of an individual capacitor element. The change, which is produced on account of the failure of the capacitor element, in the current flowing through the capacitor unit and/or in the voltage occurring across the capacitor unit (capacitor unit voltage) is likewise very slight.

Failures of this kind of individual capacitor elements can occur, in particular, when a dedicated fuse is associated with each of the capacitor elements. In the event of failure of a capacitor element of this kind and the associated fuse blowing, only a very slight change in the capacitance of the capacitor unit and consequently only a very slight change in the current or the voltage of the affected capacitor unit occur.

In order to directly measure this slight change, highly accurate and therefore expensive measuring devices would have to be used. Nevertheless, problems would occur, particularly in industrial environments, in order to distinguish these slight changes in voltage or current intensity from interference and electrical noise. Nevertheless, identifying failing capacitor elements is important: since capacitor elements which are often connected in parallel are arranged in the capacitor units, a failure of one (or several) of the capacitor elements which are connected in parallel can specifically lead, for example, to dangerous overloading of the other capacitor elements of the parallel circuit.

SUMMARY OF THE INVENTION

The invention is based on the object of specifying a method and an arrangement by way of which the failure of a single capacitor element can already be securely and reliably identified.

According to the invention, this object is achieved by a method and by an arrangement as claimed in the independent patent claims. Advantageous embodiments of the method and of the arrangement are specified in the dependent patent claims.

The invention discloses a method for monitoring a capacitor bank (in particular a high-voltage capacitor bank) which has a plurality of capacitor units, wherein each capacitor unit has a plurality of electrical capacitor elements, and wherein the capacitor units are subdivided into several groups of capacitor units and a (dedicated) group monitoring unit is associated with each group of capacitor units,
  wherein in the method
  each group of capacitor units is monitored for a failure of a capacitor element in one of the capacitor units of the group by means of the associated group monitoring unit, and,
  when a failure of this kind of a capacitor element is identified, data which describes this failure of the capacitor element is transmitted from the group monitoring unit to a (central) monitoring receiver.

In this case, the monitoring receiver is associated with several groups of capacitor units. For example, the monitoring receiver forwards the data to a monitoring control center for the capacitor bank.

It is advantageous here that a dedicated group monitoring unit is associated with each group of capacitor units, which group monitoring unit monitors only this group of capacitor units for a failure of a capacitor element. As a result, the monitoring of the capacitor bank is shared amongst the group monitoring units of the individual groups, so that each group of capacitor units is monitored independently of the other groups. This results, firstly, in reliable monitoring of the individual groups. Secondly, each group monitoring unit is responsible for monitoring a relatively small number of capacitor units (in comparison to the total number of capacitor units of the capacitor bank), so that this group monitoring unit can identify the failure of a single capacitor element more reliably. Each group preferably has between 2 and 8 capacitor units.

The method can be configured such that data about the capacitor unit containing the failed capacitor element can be transmitted from the group monitoring unit to the monitoring receiver. On account of this data, the capacitor unit containing the failed capacitor element can advantageously be precisely identified. This capacitor unit can then be replaced in a targeted manner for example, and a time-consuming search for the affected capacitor unit (for example by means of a capacitance measuring bridge) is avoided.

The method can be configured such that the capacitor elements which are arranged in the capacitor units are connected electrically in parallel and/or in series. Owing to the arrangement of the capacitor elements in electrical series circuits and/or parallel circuits, the capacitor unit voltages and capacitor unit currents can be matched to the requirements in wide limits for the capacitor units. This is advantageous particularly for high-voltage capacitor banks in which a relatively high capacitor unit voltage is provided by each individual capacitor unit.

The method can be configured such that the capacitor units each have a housing, in particular a metal housing, which surrounds all of the capacitor elements of the respective capacitor unit. This housing firstly ensures sufficient mechanical stability of the capacitor units. Secondly, electrical shielding of the capacitor elements of the individual capacitor units is realized by the housing.

The method can also proceed such that the capacitor units of the capacitor bank are arranged in at least one electrical series circuit and/or in at least one electrical parallel circuit. Particularly high voltages can be realized by the electrical series connection of the capacitor units; and high currents can be realized by the electrical parallel connection of the capacitor units. Owing to suitable selection of parallel circuits and series circuits, a technically advantageous structure of the capacitor bank can be realized in particular.

The method can also be configured such that the group monitoring units are each substantially at the electrical potential of the group of capacitor units which is associated with them, and the monitoring receiver is substantially at ground potential. It is particularly advantageous here that only comparatively modest requirements in respect of electrical insulation and dielectric strength are made of group monitoring units because said group monitoring units are at the electrical potential of the group of capacitor units which is associated with them. As a result, the group monitoring units can be realized in a cost-effective manner. For example, measurement of the capacitor unit voltage and of the capacitor unit current by the group monitoring units is possible in a comparatively simple and cost-effective manner.

The method can also be configured such that the group monitoring units are each supplied with electrical power which is coupled out from the group of capacitor units with which the respective group monitoring unit is associated. As a result, the group monitoring units can be supplied with electrical power in a simple and cost-effective manner. In particular, this prevents electrical lines or the like for power supply having to be laid to each group monitoring unit, which firstly would be expensive and complicated and secondly (in particular in the case of high-voltage capacitor banks) would be problematical on account of the high voltage differences which occur between the groups of capacitor units and ground potential.

The method can also proceed such that the electrical power is coupled out from a magnetic field, which is formed on account of the electric current flowing through the group of capacitor units, by means of a current transformer. The electrical power for supplying the group monitoring units can be coupled out in a particularly simple manner by means of the current transformer. This power is provided by the current flowing through the group of capacitor units.

The method can also proceed such that the data about the failure of the capacitor element is transmitted from the group monitoring unit to the monitoring receiver by means of a radio signal or by means of an optical waveguide. This advantageously ensures the electrical insulation between the group monitoring units and the monitoring receiver which is at ground potential.

The method can also proceed such that the capacitor bank has several levels which are electrically insulated from one another and on each of which at least one of the groups of capacitor units and the associated group monitoring unit are arranged. The capacitor units of one group are each advantageously arranged on one level of the capacitor bank, so that said capacitor units firstly form a physical unit. Secondly, the housings of the capacitor units can be electrically connected to the level floor which forms a uniform reference potential (for example for the voltage measurement, current measurement and/or measurement value processing) for all of the capacitor units of the group.

The method can also proceed such that, in the case of capacitor units of a group which are arranged electrically in a parallel circuit, the current difference between the current flowing through this capacitor unit and the current flowing through the capacitor units on average is ascertained for each of the capacitor units of the parallel circuit,
   a mean value of the current differences of the capacitor units is ascertained,
   the ratio of the current difference and the mean value is formed for each of the capacitor units,
   the change in the ratio with respect to time is monitored, and
   the occurrence of a defective capacitor element in the respective capacitor unit is identified when the change in the ratio with respect to time exceeds a predetermined first threshold value.

The method can also proceed such that, as an alternative or in addition, in the case of capacitor units of a group which are arranged electrically in a series circuit, the capacitor unit voltage which occurs across each of the capacitor units is ascertained,
   the voltage difference between the capacitor unit voltages and the average capacitor unit voltage of the capacitor units of the series circuit is ascertained in each case,
   a mean value of these voltage differences is ascertained,
   the ratio of the respective voltage difference and the mean value is formed for the capacitor units,
   the change in the ratio with respect to time is monitored, and
   the occurrence of a defective capacitor element in the respective capacitor unit is identified when the change in the ratio with respect to time exceeds a predetermined second threshold value.

In this method, it is particularly advantageous that, in the case of the parallel circuit, the current differences between the current flowing through the capacitor units and the average current flowing through the capacitor units (or in the case of the series circuit the voltage differences between the capacitor unit voltages and the average capacitor unit voltage) are each ascertained and evaluated in the further course of the method. Since the capacitor units are generally of substantially identical design, the current differences (or voltage differences) are very slight in the intact state. If a change in the current differences or the voltage differences then occurs (owing to a failure of a capacitor element), this change is then relatively large in percentage terms and can therefore be reliably identified. Furthermore, it is advantageous that, in the case of the parallel circuit, the ratio of the current difference and the mean value of the current differences of the capacitor units (or in the case of the series circuit the ratio of the voltage difference and the mean value of the voltage differences of the capacitor units) is ascertained and monitored in each case. Owing to this formation of a ratio, the dependence on the absolute magnitude of the capacitor unit current or of the capacitor unit voltage is dispensed with. As a result, the method functions in an equally reliable manner in virtually all operating states of the capacitor bank, that is to say it functions, for example, at operating currents of 60%, 80% or 100% of the rated current or at operating voltages of 60%, 80% or 100% of the rated voltage.

The method can also proceed such that the electrical voltage which occurs in each case at a connection of the capacitor units is ascertained by means of a current signal which is respectively fed out from the capacitor units and is proportional to the voltage which occurs at the connection of the respective capacitor unit and which is converted into a voltage signal outside the capacitor unit. Improved insensitivity of signal transmission to interference is achieved owing to the current signals.

The invention furthermore discloses an arrangement comprising a capacitor bank (in particular comprising a high-voltage capacitor bank) which has a plurality of capacitor units, wherein each capacitor unit has a plurality of electrical capacitor elements, and wherein the capacitor units are subdivided into several groups of capacitor units, and comprising several group monitoring units, wherein one of the group monitoring units is associated with each group of capacitor units, and at least one of the group monitoring units is configured such that it monitors the respective group of capacitor units for a failure of a capacitor element in one of the capacitor units of the group and, when a failure of this kind of a capacitor element is identified, data which describes this failure of the capacitor element is transmitted to a monitoring receiver.

The arrangement can be configured such that the capacitor elements which are arranged in the capacitor units are connected electrically in parallel and/or in series.

The arrangement can also be configured such that the capacitor units each have a housing, in particular a metal housing, which surrounds all of the capacitor elements of the respective capacitor unit.

The arrangement can be configured such that the capacitor units of the capacitor bank are arranged in at least one electrical series circuit and/or in at least one electrical parallel circuit.

The arrangement can also be configured such that the group monitoring units are each substantially at the electrical potential of the group of capacitor units which is associated with them, and the monitoring receiver is substantially at ground potential.

The arrangement can also be configured such that a power supply device is associated with at least one group monitoring unit, which power supply device couples out electrical power for supplying the group monitoring unit from the group of capacitor units with which the respective group monitoring unit is associated.

The arrangement can be configured such that the group monitoring unit has a current transformer which couples out the electrical power from a magnetic field which is formed on account of the electric current flowing through the group of capacitor units.

The arrangement can also be configured such that at least one group monitoring unit has a wireless transmission unit (radio transmitter) which transmits the data about the failure of the capacitor element to the monitoring receiver by means of a radio signal, and/or
  at least one group monitoring unit is connected to the monitoring receiver by means of an optical waveguide in order to transmit the data about the failure of the capacitor element to the monitoring receiver via the optical waveguide.

The arrangement can be configured such that the capacitor bank has several levels which are electrically insulated from one another and on each of which at least one of the groups of capacitor units and the associated group monitoring unit are arranged.

The arrangement can also be configured such that at least one group monitoring unit is configured such that this group monitoring unit,
  in the case of capacitor units of a group which are arranged electrically in a parallel circuit,
    ascertains the current difference between the current flowing through this capacitor unit and the current flowing through the capacitor units on average for each of the capacitor units of the parallel circuit,
    ascertains a mean value of the current differences of the capacitor units,
    forms the ratio of the current difference and the mean value for each of the capacitor units,
    monitors the change in the ratio with respect to time, and
    identifies the occurrence of a defective capacitor element in the respective capacitor unit when the change in the ratio with respect to time exceeds a predetermined first threshold value, and/or,
  in the case of capacitor units of a group which are arranged electrically in a series circuit,
    ascertains the capacitor unit voltage which occurs across each of the capacitor units,
    ascertains the voltage difference between the capacitor unit voltages and the average capacitor unit voltage of the capacitor units of the series circuit in each case,
    ascertains a mean value of these voltage differences,
    forms the ratio of the respective voltage difference and the mean value for the capacitor units,
    monitors the change in the ratio with respect to time, and
    identifies the occurrence of a defective capacitor element in the respective capacitor unit when the change in the ratio with respect to time exceeds a predetermined second threshold value.

The arrangement can also be configured such that the capacitor units are each provided with a current path which leaves the respective capacitor unit and is designed for feeding out a current signal, which is proportional to the voltage which occurs at a connection of the respective capacitor unit, from the respective capacitor unit.

The described method and the described arrangement have the same or similar advantages.

The invention will be explained in more detail below with reference to exemplary embodiments. Here, identical reference signs refer to identical or similarly acting elements.

BRIEF DESCRIPTION OF THE SEVERAL VIEWS OF THE DRAWING

FIG. 7 shows an exemplary embodiment of a group of capacitor units which each constitute a signal current source, FIG. 8 shows an exemplary embodiment of a capacitor unit comprising resistor circuitry for voltage measurement, and FIG. 9 shows an exemplary embodiment of a group of capacitor units comprising resistor circuitry for voltage measurement.

DETAILED DESCRIPTION OF THE INVENTION

Figure 1:
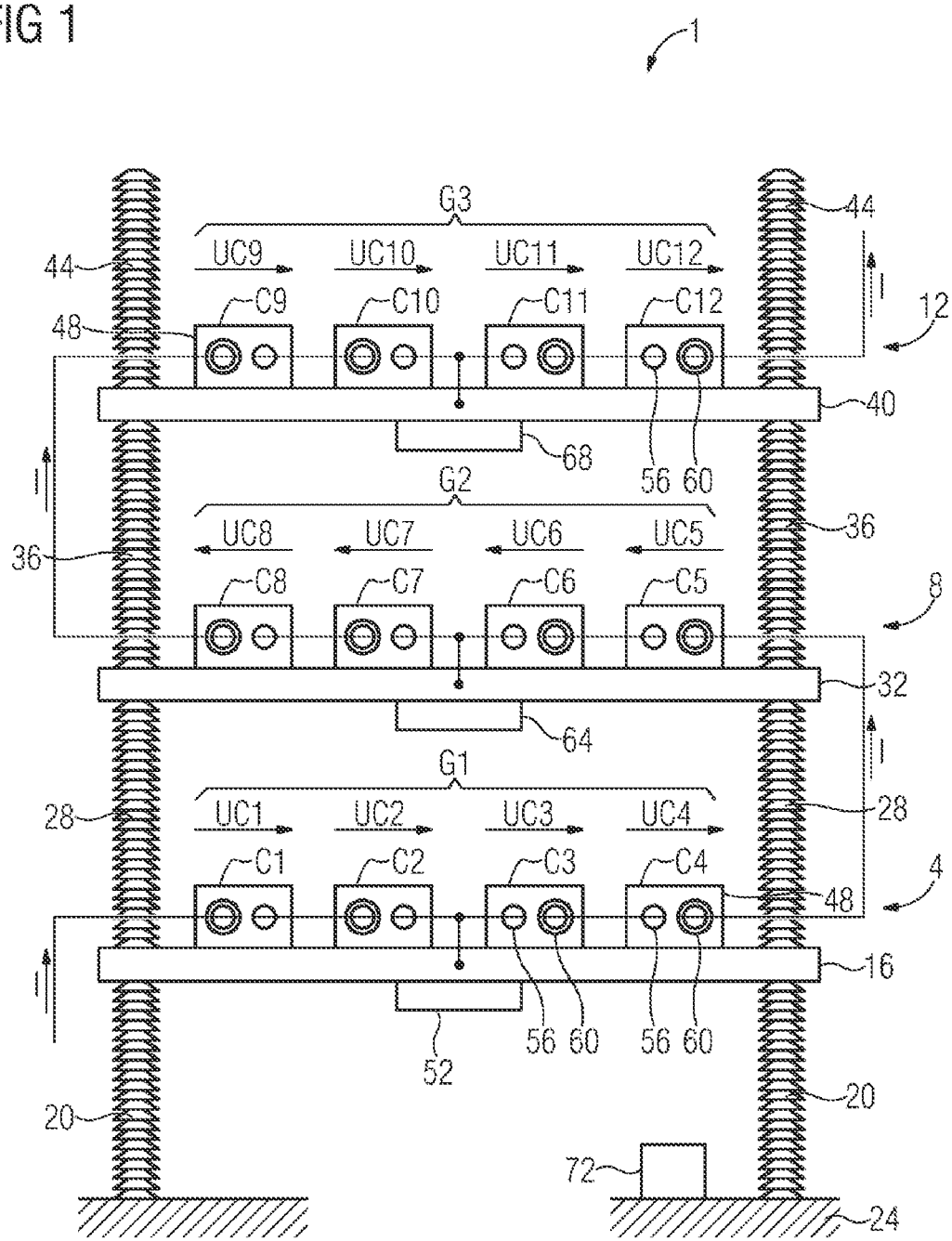
FIG. 1 shows an exemplary embodiment of a capacitor bank comprising three groups of capacitor units.

FIG. 1 shows an exemplary embodiment of a capacitor bank 1 which is configured, by way of example, as a capacitor tower 1. The capacitor bank 1 is, by way of example, a high-voltage capacitor bank. This high-voltage capacitor bank has a rated voltage of more than 50 kV, for example a rated voltage of 500 kV. This capacitor bank 1 has a first level 4, a second level 8 and a third level 12. The capacitor bank 1 can, of course, also have still further levels.

The first level 4 has a first level floor 16 which is supported by first supporting insulators 20. In this case, the first supporting insulators 20 mechanically support the first level 4 and insulate the electrical potential of the first level 4 from ground potential 24. A second level floor 32 of the second level 8 is supported on the first level 4 with the aid of second supporting insulators 28. In the same way, a third level floor 40 of the third level 12 is constructed on the second level 8 by means of third supporting insulators 36. Fourth supporting insulators 44 are arranged on the third level floor 40, a further level (not illustrated) of the capacitor tower 1 being held on said fourth supporting insulators. The supporting insulators ensure the mechanical stability of the capacitor tower and electrically insulate the individual levels from one another and from ground potential 24. The individual levels 4, 8, 12 of the capacitor bank 1 are therefore electrically insulated from one another by means of the supporting insulators. In this case, the supporting insulators each have a large number of shields in order to extend the creepage paths (for example in the event of condensation).

A first group G1 of capacitor units is arranged in the first level 4. This first group of capacitor units G1 has a first capacitor unit C1, a second capacitor unit C2, a third capacitor unit C3 and a fourth capacitor unit C4. The four capacitor units C1-C4 are arranged electrically in a series circuit. This means that the capacitor unit current I through all of the capacitor units C1-C4 of the group G1 has the same magnitude. A first capacitor unit voltage UC1 is dropped across the first capacitor unit C1, a second capacitor unit voltage UC2 is dropped across the second capacitor unit C2, a third capacitor unit voltage UC3 is dropped across the third capacitor unit C3, and a fourth capacitor unit voltage UC4 is dropped across the fourth capacitor unit C4. The four capacitor units C1-C4 are arranged on the first level floor 16.

Each capacitor unit has a housing 48. Therefore, the capacitor units C1-C4 each have a housing which surrounds all of the capacitor elements of the respective capacitor unit. This housing 48 is preferably an electrically conductive housing, in particular a metal housing 48. Each capacitor unit has a first connection 56 (first pole 56) and a second connection 60 (second pole 60). Therefore, said capacitor units are capacitor units with in each case two connections or two poles. On the outside, each capacitor unit acts like a large capacitor.

Each connection can be fed through the metal housing of the capacitor unit in particular by means of a bushing.

The housing 48 of the capacitor units C1-C4 of the first group is in each case electrically connected to the first level floor 16 which is preferably configured as a metal level floor (and therefore electrically conductive level floor 16). A first group monitoring unit 52 is arranged on the first level floor 16. In the illustration of FIG. 1, this first group monitoring unit is arranged on the bottom side of the first level floor 16, but this is to be understood merely by way of example. The first group monitoring unit 52 can, of course, also be arranged on the top side of the first level floor 16, for example next to the capacitor units C1-C4. The first group monitoring unit 52 is connected to voltage sensors, not illustrated, on the capacitor units by means of measuring lines, not illustrated. The voltage sensors are electrically connected to the connections 56 or 60 of the individual capacitor units, also see FIG. 3. The first group monitoring unit 52 is therefore able to measure the voltages across the connections 56 or 60 of the individual capacitor units (with respect to the electrical potential of the first level floor 16) and therefore to ascertain the capacitor unit voltages UC1-UC4. Those connections of the capacitor units at which the voltages are preferably measured with respect to the potential of the first level floor 16 are marked by a double circle in this case.

In the same way, a second group G2 of capacitor units C5, C6, C7 and C8 is arranged on the second level 8 of the capacitor bank 1. A second group monitoring unit 64 is associated with this second group G2 of capacitor units. In the same way, a third group G3 of capacitor units C9, C10, C11 and C12 is also arranged on the third level 12 of the capacitor bank 1. A third group monitoring unit 68 is associated with this third group G3.

The first group monitoring unit 52 monitors the capacitor units C1-C4 of the first group G1 for a failure of a capacitor element in one of the capacitor units C1-C4. When a failure of this kind of a capacitor element is identified, the first group monitoring unit 52 transmits data, which describes this failure of the capacitor element, to a monitoring receiver 72. This data can be transmitted to the monitoring receiver 72 by means of a radio signal or by means of an optical waveguide. The monitoring receiver 72 either processes this data, which describes the failure of the capacitor element, itself or forwards this data, which describes the failure of the capacitor element, to a monitoring control center for the capacitor bank 1. In the last-mentioned case, the monitoring receiver 72 has the function of a gateway. The data contains an indicator of that capacitor unit C1, C2, C3 or C4 for which a fault of a capacitor element has been identified. This indicator can be, for example, a number (ID) of the affected capacitor unit or another indicator. Therefore, the capacitor unit of the first group in which a capacitor element has failed is known in the data receiver (that is to say in the monitoring receiver 72 or in the monitoring control center). The second group G2 is monitored in the same way by means of the second group monitoring unit 64; and the third group monitoring unit 68 monitors the third group G3 of capacitor units in the same way.

The capacitor units C1-C12 of the capacitor bank 1 are therefore subdivided into three different groups G1, G2 and G3 in the exemplary embodiment. A dedicated group monitoring unit 52, 64 and, respectively, 68 is associated with each of these groups G1, G2 and G3; that is to say the capacitor units of each group are monitored for the failure of a capacitor element by the group monitoring unit which is exclusively associated with it. As a result, a shared monitoring method for the capacitor bank 1 or shared monitoring of the individual groups is realized.

The first group monitoring unit 52 is at the electrical potential of the group G1 of capacitor units which is associated with it. The monitoring receiver 72 is at ground potential 24. More than one monitoring receiver 72 can also be associated with one capacitor bank. Therefore, for example, two monitoring receivers can be associated with one capacitor bank. In this case, one monitoring receiver can, for example, be associated with some of the groups of capacitor units and the other monitoring receiver is associated with the remaining groups of capacitor units of the capacitor bank.

In the exemplary embodiment of FIG. 1, the capacitor units C1-C12 of the capacitor bank 1 are arranged in an electrical series circuit. In another exemplary embodiment, the capacitor units of the capacitor bank can, however, also be arranged in an electrical parallel circuit. Series circuits of capacitor units and parallel circuits of capacitor units can be present in a further exemplary embodiment of a capacitor bank. For example, several capacitor units can each be connected in a parallel circuit and these parallel circuits can then be connected electrically in a series circuit. In the exemplary embodiment of FIG. 1, a simple series circuit of capacitor units is shown by way of example. A so-called H-circuit of the capacitor units is often used in practice, in which H-circuit in particular only each second level floor is electrically conductively connected to the current path of a series circuit. The other level floors are electrically conductively connected to the current path of a second series circuit of the H-circuit.

Figure 2:
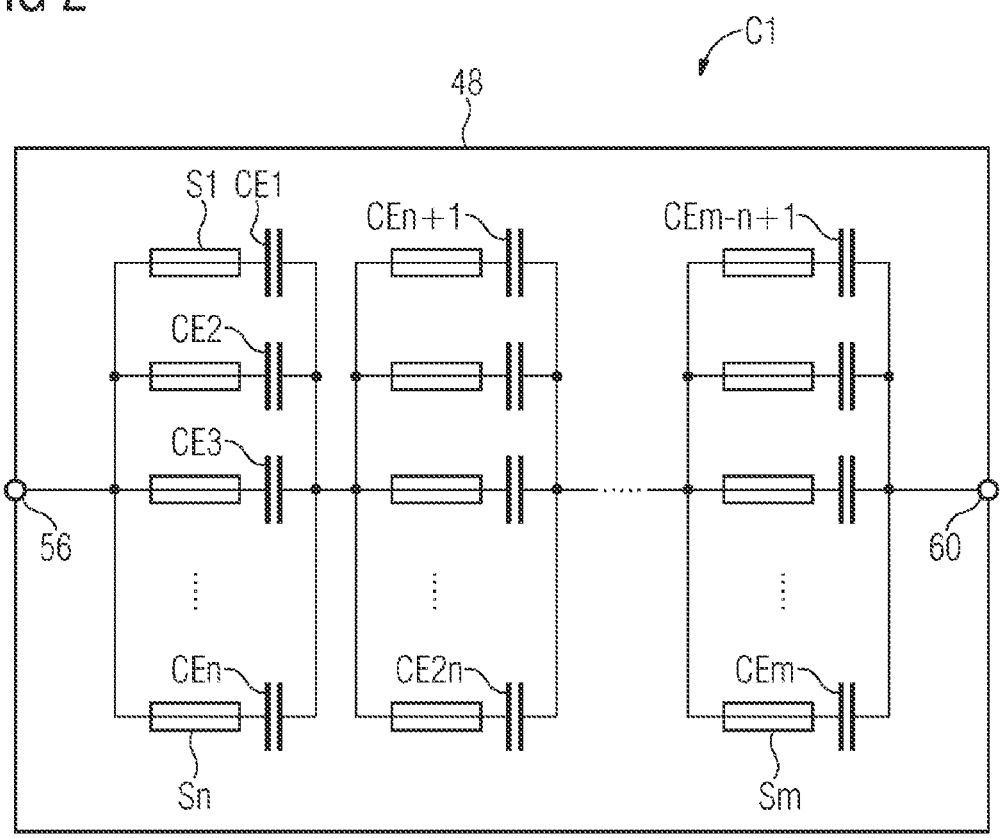
FIG. 2 shows an exemplary embodiment of a capacitor unit comprising individual capacitor elements.

FIG. 2 shows an exemplary embodiment of a capacitor unit using the example of the first capacitor unit C1. The other capacitor units C2-C12 can be constructed in a similar way to the first capacitor unit C1. The first capacitor unit C1 has m capacitor elements CE, and these capacitor elements CE each constitute individual capacitors. The capacitor elements are also referred to as capacitor windings. A fuse S, which blows in the event of a short-circuit of the associated capacitor element, can optionally be associated with each capacitor element CE. Both capacitor elements with a fuse and also capacitor elements without a fuse can be arranged in a capacitor unit. Capacitor elements with a fuse are also referred to as fused capacitor elements; capacitor elements without a fuse are also referred to as non-fused capacitor elements.

The method described below for shared monitoring of the capacitor units is particularly advantageous in the case of fused capacitor elements since, in the event of a failure of an individual capacitor element, the remaining intact capacitor elements continue to operate. The resulting small change in the total capacitance is difficult to identify using conventional monitoring methods for the entire capacitor bank, however.

In the exemplary embodiment, in each case n capacitor elements are arranged in a parallel circuit; and the parallel circuits are connected electrically in series and form a series circuit. One end of this series circuit is electrically connected to the first connection 56 of the capacitor unit, and the other end of the series circuit is electrically connected to the second connection 60 of the capacitor unit.

Therefore, when, for example, the third capacitor element CE3 of the first capacitor unit C1 fails, the first group monitoring unit 52 then identifies this failure and sends, with the data which describes the failure, an identifier of the first capacitor unit C1 to the monitoring receiver 72.

Figure 3:
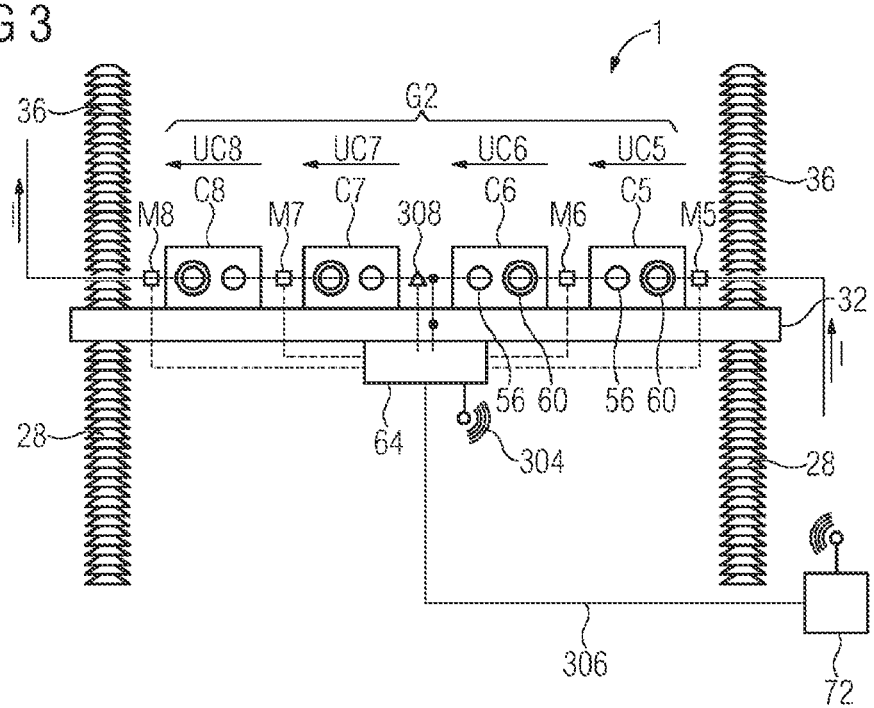
FIG. 3 shows a detail of the capacitor bank comprising a group of capacitor units which are connected electrically in series.

FIG. 3 shows, by way of example, a detail of the capacitor bank 1. This detail shows the second group G2 of the capacitor units C5-C8. The capacitor units C5-C8 are connected electrically in series. The second group monitoring unit 64 which is associated with this group of capacitor units C5-C8 sends data about the failure of a capacitor element of the capacitor units C5-C8 of the group G2 to the monitoring receiver 72 by means of a radio signal 304. To this end, the second group monitoring unit 64 has a radio transmitter (wireless transmission unit); and the monitoring receiver 72 has a radio receiver. As an alternative or in addition, the data can also be transmitted from the second group monitoring unit 64 to the monitoring receiver 72 by means of an optical waveguide 306 (or by means of another wireless data transmission technique).

A voltage sensor is associated with each connection of a capacitor unit. Therefore, a first voltage sensor M5 is associated with the second connection 60 of the fifth capacitor unit C5; and a second voltage sensor M6 is associated with the second connection 60 of the sixth capacitor unit C6. The electrical potential of the second connection 60 of the fifth capacitor unit C5 can be measured by means of the first voltage sensor M5. The electrical potential of the second connection 60 of the sixth capacitor unit C6 (which is identical to the electrical potential of the first connection 56 of the fifth capacitor unit C5) can be measured by means of the second voltage sensor M6.

The connecting point between the sixth capacitor unit C6 and the seventh capacitor unit C7 is electrically connected to the second level floor 32, and this electrical potential of the connecting point is likewise forwarded to the group monitoring unit 64. This electrical potential of the connecting point serves as a reference potential for the voltage measurement. Furthermore, a third voltage sensor M7 and a fourth voltage sensor M8 are arranged at the connections of the seventh capacitor unit C7 and of the eighth capacitor unit C8. The electrical potentials at the connections of the individual capacitor units can be ascertained by means of these voltage sensors M5-M8. The capacitor unit voltages UC5-UC8 which are each associated with the capacitor units can be calculated from these potentials. The second group monitoring unit 64 is connected to the voltage sensors M5-M8 by means of measuring lines (illustrated using dashed lines). The capacitor units of the group G2 are arranged with mirror-image symmetry with respect to the connecting point.

For example, the first voltage sensor M5 measures the electrical potential difference between the second connection 60 of the fifth capacitor unit C5 and the potential of the second level floor 32. This measurement value Umess5 corresponds to the sum of the capacitor unit voltage UC5 of the fifth capacitor unit C5 and the capacitor unit voltage UC6 of the sixth capacitor unit C6: Umess5=UC5+UC6. The sixth voltage sensor M6 measures the electrical potential difference between the second connection 60 of the sixth capacitor unit C6 and the potential of the second level floor 32: Umess6=UC6. The capacitor unit voltage UC5 of the fifth capacitor unit C5 is then given in accordance with UC5=Umess5−Umess6.

The following effect should be noted with this manner of determining the capacitor unit voltages: when a capacitor element fails in the sixth capacitor unit C6, this then causes a change in the directly measured voltage UC6 and in the calculated voltage UC5. Therefore if in each case one capacitor element appears to fail in the fifth capacitor unit C5 and in the sixth capacitor unit C6 at the same time, there is actually only a failure in the sixth capacitor unit C6. This can be automatically taken into account when evaluating the data. However, it is also possible in principle (possibly using a more complicated voltage measurement technique) to directly measure all of the capacitor unit voltages. The described effect does not then occur.

The capacitor units of a group which are fitted on the level all have the same electrical potential on their conductive housings. This is ensured by way of the level floor likewise being electrically conductive. The level floor can consist, for example, of metal. The voltages are measured, in particular, with respect to the electrical potential of the level floor. As a result, it is possible to connect all of the current sensors or voltage sensors of a group to the group monitoring unit in a relatively problem-free manner. The measuring lines do not need to be designed for particularly large voltage differences for example. Good electromagnetic shielding of the capacitor units is achieved by the conductive housing.

Furthermore, a power coupling-out component 308 is arranged at the connecting point between the sixth capacitor unit C6 and the seventh capacitor unit C7. Electrical power is coupled out from the group G2 of the capacitor units C5-C8 by means of this power coupling-out component 308. This electrical power serves to supply the second group monitoring unit 64. Therefore, the power coupling-out component 308 constitutes a power supply device 308 for the second group monitoring unit 64. The power coupling-out component 308 is electrically connected to the second group monitoring unit 64 via a power supply line.

The power coupling-out component may be, in particular, a current transformer 308. Said current transformer couples out electrical power (for example in the form of alternating current) from the magnetic field which forms on account of the electric current I flowing through the group G2 of capacitor units C5-C8.

The alternating current (secondary current) which is coupled out from the magnetic field by means of the current transformer is rectified by means of a rectifier in the usual way. The DC voltage is stabilized and an apparatus for reducing voltage peaks, for example an overcurrent surge arrester, can additionally be provided.

In the series circuit of capacitor units illustrated in FIG. 3, the electric current I flowing through this series circuit is of equal magnitude in all of the capacitor units. Therefore, the capacitor unit voltages UC5-UC8 which occur across the capacitor units are ascertained and evaluated in order to identify a failure of a capacitor element.

The illustration of FIG. 3 should not be understood such that the voltage sensors M5 to M8 are necessarily freely suspended voltage sensors which each constitute a dedicated device. Rather, in view of the costs of insulation of a voltage sensor, it is advantageous when the voltage sensor is integrated into the respective capacitor unit. The voltage sensor can therefore be integrated into the housing of the respective capacitor unit.

Figure 4:
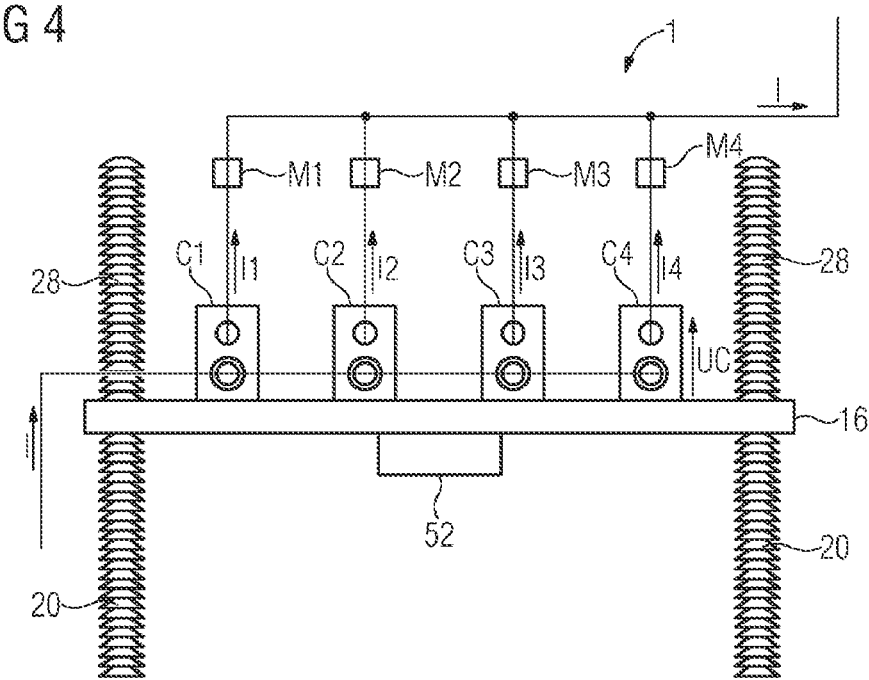
FIG. 4 shows a detail of a further capacitor bank comprising a group of capacitor units which are connected electrically in parallel.

FIG. 4 illustrates a further exemplary embodiment of a group of capacitor units C1-C4, wherein these capacitor units C1-C4 are connected electrically in parallel. Therefore, the same capacitor unit voltage UC is applied across each of all four of the capacitor units C1-C4. However, the electric current I1-I4 flowing through the electrical capacitor units can be of different magnitudes in each case. Therefore, the current I1-I4 flowing through the capacitor units in each case is measured by means of current sensors M1-M4. Corresponding current measurement values are transmitted to the associated group monitoring unit 52 and evaluated therein. In this case, the current sensors M1-M4 do not necessarily need to be arranged at the point indicated in FIG. 4. In particular, it is expedient from an insulation point of view when the current sensors M1-M4 (current transformers M1-M4) are close to the electrical potential of the level floor 16. For example, the current sensors M1-M4 can advantageously be arranged at those connections of the capacitor units that face the first level floor 16. These connections are marked by means of a double circle in FIG. 4.

Figure 5:
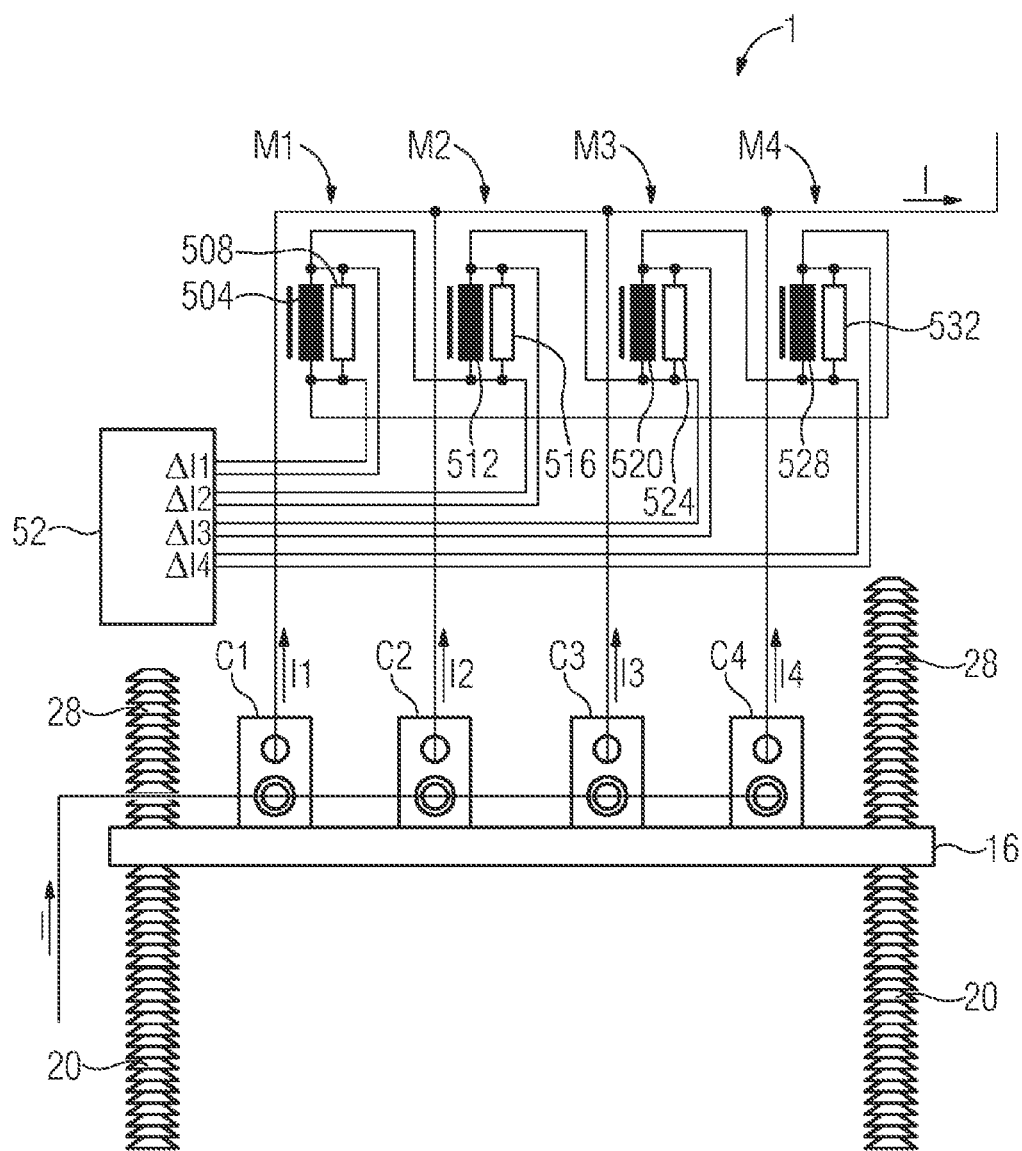
FIG. 5 shows the group of capacitor units which are connected electrically in parallel comprising a circuit for ascertaining current differences.

FIG. 5 illustrates the configuration of the current measurement arrangement by means of the current sensors M1-M4 in more detail. The first current sensor M1 is configured as a first current transformer 504. A first resistor 508 is connected in parallel to the first current sensor M1 (more precisely in parallel to the secondary winding of the first current sensor M1). The second current sensor M2 is likewise configured as a second current transformer 512 with a resistor 516 which is connected in parallel. In the same way, the third current sensor M3 is configured as a third current transformer 520 with a third resistor 524 which is connected in parallel, and the fourth current sensor M4 is configured as a fourth current transformer 528 with a fourth resistor 532 which is connected in parallel. The resistors 508, 516, 524 and 532 can also be referred to as measuring resistors or shunt resistors.

The secondary windings of the current transformers 504, 512, 520 and 528 are connected electrically in series, wherein the series circuit is connected to form a closed mesh. As a result, a mean current Iav, which is substantially proportional to the mean current flowing through the four capacitor units C1-C4 flows through the secondary windings of the four current transformers 504, 512, 520 and 528. When the current flowing through a capacitor unit differs from the mean current Iav flowing through the capacitor units (for example because one capacitor element has failed in this capacitor unit), the proportion of the current flowing in the mesh, which proportion corresponds to this differing current, flows through the resistor (which is connected in parallel to the current transformer which is associated with this capacitor unit) and generates a voltage signal at this resistor. This voltage signal is proportional to the current difference $\Delta In$ between the current In flowing through the corresponding capacitor unit and the current Iav flowing through the capacitor units C1-C4 on average (average current Iav). In this way, the current difference $\Delta I1, \Delta I2, \Delta I3$ or $\Delta I4$ is ascertained in each case by means of the circuit illustrated in FIG. 5 in an analogous way as for the four capacitor units C1-C4 of the group. This is the current difference between the current I1, I2, I3 or I4 flowing through the respective capacitor unit and the current Iav flowing through the capacitor units on average.

For the current Iav flowing through the capacitor units on average:

$$Iav = \frac{1}{x}\sum_{n=1}^{x} In$$

where x is the number of capacitor units of the group. Here, $$Iav = \frac{I1 + I2 + I3 + I4}{4}$$

Therefore, the current differences $\Delta In$ are advantageously ascertained in that the secondary windings of the current transformer are arranged in a common mesh, so that the same current flows through all of the secondary windings. As a result, the current differences $\Delta In$ can be ascertained in a particularly simple manner. However, a different way of ascertaining the current differences $\Delta In$ is, of course, also possible, for example measuring the currents I1, I2, I3 and I4 respectively flowing through the capacitor units and then calculating the current differences $\Delta In$.

Measurement values of these current differences $\Delta In$ are transmitted to the first group monitoring unit 52 and processed further there. To this end, a mean value $\Delta Iav$ of these current differences $\Delta I1, \Delta I2, \Delta I3$ and $\Delta I4$ is ascertained:

$$\Delta Iav = \frac{1}{x}\sum_{n=1}^{x} \Delta In$$

where x is the number of capacitor units of the group. Here, $$\Delta Iav = \frac{\Delta I1 + \Delta I2 + \Delta I3 + \Delta I4}{4}$$

The ratio of the current difference $\Delta In$ and the mean value $\Delta Iav$ is then in each case formed for each capacitor unit. The change in this ratio with respect to time is then monitored in respect of whether the change with respect to time exceeds a predetermined first threshold value:

$$\frac{d\left(\frac{\Delta In}{\Delta Iav}\right)}{dt} > SW1$$

When this change in the ratio with respect to time exceeds the predetermined first threshold value SW1, it is identified that there is a defective capacitor element in the respective capacitor unit Cn. The first group monitoring unit 52 then sends data containing information about the corresponding capacitor unit Cn to the monitoring receiver 72.

It is particularly advantageous here for the ratio $$\frac{\Delta In}{\Delta Iav}$$

to be monitored for the occurrence of a change with respect to time which exceeds the first threshold value SW1 (that is to say for the occurrence of a large change with respect to time). Owing to the use of this ratio, the current differences $\Delta In$ are related to the mean value $\Delta Iav$ of the current differences of all of the capacitor units of the group. As a result, even a small current difference in the current flowing through a capacitor unit leads to a clear change in the ratio $$\frac{\Delta In}{\Delta Iav}.$$

In this case, this change in the ratio $$\frac{\Delta In}{\Delta Iav}$$

is so large that it clearly differs from noise or from coupled-in interference signals. Therefore, reliable and dependable identification of the failure of an individual capacitor element is possible.

In the case of a series circuit of capacitor units in a group, the identification of a failed capacitor element takes place as follows:

In a first step, the capacitor unit voltages UC1, UC2, UC3 and UC4 which respectively occur across the capacitor units are ascertained. This is done, as described above in conjunction with FIG. 3, by measuring the electrical potentials, which occur at the connections of the capacitor units, in relation to the electrical potential of the level floor (rack).

The average capacitor unit voltage UCav of the capacitor units of the series circuit is then ascertained in accordance with $$UCav = \frac{1}{x}\sum_{n=1}^{x} UCn$$

where x is the number of capacitor units of the group. Here, $$UCav = \frac{UC1 + UC2 + UC3 + UC4}{4}$$

The voltage difference $\Delta UCn$ between the respective capacitor unit voltage UCn and the average capacitor unit voltage UCav of the capacitor units of the series circuit is then ascertained for all of the capacitor unit voltages in each case in accordance with $$\Delta UCn = UCn - UCav$$

In the next step, a mean value $\Delta Uav$ of these voltage differences $\Delta Ucn$ is ascertained in accordance with $$\Delta Uav = \frac{1}{x}\sum_{n=1}^{x} \Delta UCn$$

where x is the number of capacitor units of the group. Here, $$\Delta Uav = \frac{\Delta UC1 + \Delta UC2 + \Delta UC3 + \Delta UC4}{4}$$

The ratio of the respective voltage difference $\Delta UCn$ and the mean value $\Delta Uav$ is then in each case formed for the capacitor units. This ratio $\Delta UCn/\Delta Uav$ is then monitored in respect of whether the change in the ratio with respect to time exceeds a predetermined second threshold value:

$$\frac{d\left(\frac{\Delta UCn}{\Delta Uav}\right)}{dt} > SW2$$

When the change in the ratios $\Delta UCn/\Delta Uav$ with respect to time exceeds the predetermined second threshold value SW2, the occurrence of a defective capacitor element in the respective capacitor unit Cn is then identified and corresponding data is transmitted by the group monitoring unit which is associated with the group to the monitoring receiver 72.

Therefore, in the series circuit of capacitor units, the capacitor unit voltages which occur across the individual capacitor units and the voltage differences between the capacitor unit voltages are ascertained. Although the change in the capacitor unit voltage on account of a failure of an individual capacitor element is very small, considerable changes with respect to time occur in said ratio on account of the voltage differences being taken into account and the ratio being formed, and said changes can be reliably identified.

The method is carried out continuously in order to ensure continuous monitoring of the capacitor units of the group.

Figure 6:
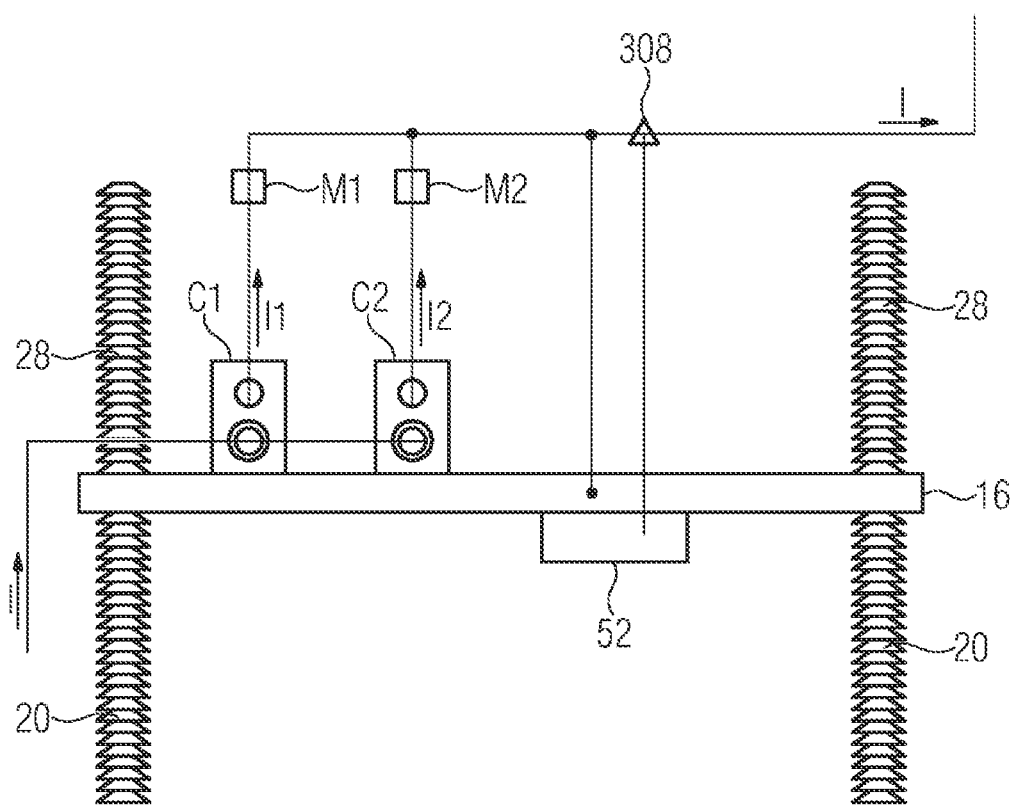
FIG. 6 shows an exemplary embodiment of a group comprising two capacitor units which are connected electrically in parallel.

FIG. 6 illustrates a further example of the method and of the arrangement for monitoring a capacitor bank. In this case, a group has only two capacitor units C1 and C2. The first current I1 flows through the first capacitor unit C1; and the second current I2 flows through the second capacitor unit C2. As a first step, the current difference $\Delta I$ between the first current I1 and the second current I2 is ascertained: $\Delta I = I1 - I2$.

In the text which follows, it is assumed that a fused capacitor element has failed. If a fused capacitor element has failed in the second capacitor unit C2 (for example on account of an interruption in the fuse which is connected in series), the current I2 then suddenly becomes smaller: I2'<I2. However, depending on the number and the interconnection of the capacitor elements in the second capacitor unit C2, the current I2 changes only by a small percentage, for example I2'=0.98 I2. The current difference is then formed once again: ΔI'=I1−I2'>ΔI. In general: when Δ1' is greater than ΔI, a capacitor element has failed in the second capacitor unit C2. When Δ1' is less than Δ1, a capacitor element has failed in the first capacitor unit C1. In this example with only two capacitor units with internal capacitor element fuses, the method is considerably simplified in relation to the general method illustrated above with more than 2 capacitor units. In general, the number of capacitor units per group is greater than 2.

In the case of non-fused capacitor elements, the change in capacitance and current in the capacitor unit is exactly reversed: a defective non-fused capacitor element short-circuits all of the capacitor elements which are connected in parallel and the effective capacitance and the current of the capacitor unit increase as a result. The change in the current of the capacitor unit is significantly greater and easier to detect than in the case of the internally fused capacitor unit.

The precise localization/identification of the defective capacitor unit is of paramount interest both in the case of non-fused capacitor elements and also in the case of fused capacitor elements, so that the capacitor bank can be disabled in good time in the case of multiple short circuits/failures within a capacitor unit, for example.

FIG. 7 illustrates a further exemplary embodiment with the second group G2 of capacitor units C5-C8. The voltage which is respectively applied to these capacitor units is ascertained by means of a current signal 15 to 18; the applied voltage is converted into a current signal 15 to 18. To this end, in each case one connection is provided with a first electrical resistor 710 in each capacitor unit. For example, one connection of the capacitor unit C8 is provided with one of the first electrical resistors 710. The current signal 18 flows via a current path out of the capacitor unit C8 through this first electrical resistor 710 and reaches a second resistor 712. To this end, a low-voltage bushing is provided in the housing of the capacitor unit. The voltage U8' which is dropped across the second resistor 712 on account of the current signal 18 is proportional to the voltage U8 which occurs at the connection of the capacitor unit. This voltage U8' is supplied to the second group monitoring unit 64 and evaluated there. In this case, the ratio of the first resistor 710 to the second resistor 712 is advantageously selected such that the voltage U8' is much smaller than the voltage U8. For example, the voltage U8' can be of the order of magnitude of approximately 10 V, while the voltage U8 amounts to a few kV (for example 20 kV). The transmission of the current signals to the second resistor 712 (which is arranged at the input of the group monitoring unit) is advantageously more insensitive to electrical interference than when a voltage signal is used. Therefore, the capacitor units are each provided with a current path which leaves the respective capacitor unit and is designed for guiding the current signal 18, 17, 16 or 15 out of the respective capacitor unit. A voltage Ug can optionally be tapped off from a resistor 714 which combines the individual current signals, said voltage being proportional to the voltage which is applied to the capacitor units on average.

FIG. 8 illustrates, by way of example, a further possible way of ascertaining the voltage which is applied to a capacitor unit, using the example of the capacitor unit C8. Similarly to in FIG. 7, in each case one current signal 17 and 18 is guided out of the capacitor unit C8 via in each case one current path to the connections of the capacitor unit C8. These current signals 17, 18 are conducted to a voltage measuring bridge. In the exemplary embodiment, the voltage measuring bridge has four resistors 812 and also one resistor 830. The voltage measuring bridge forms an H-circuit. The resistor 830 (shunt resistor 830, measurement resistor 830) forms a transverse path of the measuring bridge. A voltage ΔU, which is proportional to the voltage which is applied across the capacitor unit C8, can be tapped off from the resistor 830. This assumes that the resistors 810 and 810' are of the same size, for example 200 megaohms in each case.

However, the resistors 810 and 810' can also optionally each be matched to the voltage values U8 and U7 at the connections of the capacitor unit C8, so that the currents 18 and 17 are of approximately the same magnitude. The voltage ΔU is then substantially equal to zero when the voltage across the capacitor unit C8 is equal to the voltage across the adjoining capacitor unit C7. In this case, a voltage will then occur at the shunt resistor only when the voltage across the capacitor unit C8 or the voltage across the capacitor unit C7 changes (on account of an occurrence of a fault in a capacitor element).

In the case of small changes in voltage in a capacitor unit, the voltage across the shunt resistor will therefore exhibit a severe change.

The measuring bridge constitutes resistance circuitry for voltage measurement. The absolute magnitude of the voltages U7 and U8 is advantageously screened out by the measuring bridge and the changes in the voltages U7 or U8 are considerably amplified and as a result can be measured in a simple manner. The advantages specified for the parallel circuit of capacitor units (in particular independence from the respective operating current of the capacitor bank owing to forming a ratio in relation to the mean value and the long-term compensation of (for example temperature-related) fluctuations in the group monitoring unit) also apply here.

FIG. 9 illustrates a further exemplary embodiment for ascertaining the voltages which are applied to the capacitor units, using the example of the four capacitor units C5 to C8 which are connected electrically in series. These capacitor units are connected to a plurality of measuring bridges, wherein these measuring bridges are arranged in a network. A voltage ΔU can be tapped off from each of the resistors 830, said voltage changing severely as soon as a fault occurs in a capacitor unit. The connection of the connecting point between the capacitor units C6 and C7 to the rack potential Ur (electrical potential Ur of the level floor 32) is optional. In particular, the current Ir is relevant for the measurement in the case of a missing connection.

An arrangement comprising a capacitor bank and comprising several group monitoring units and also a method for monitoring the capacitor bank for the failure of capacitor elements have been described.

The group monitoring unit can also be referred to as a sensor node since the group monitoring unit is connected to the current or voltage sensors which are arranged on the individual capacitor units and detects and further processes the current or voltage measurement values originating from said current or voltage sensors.

In the exemplary embodiment, the group monitoring unit has a measurement value detection unit, a processing unit (measurement value processing unit, logic circuit) and a wireless transmission unit (radio transmitter). Each measured current or voltage signal is transmitted to the measurement value detection unit. The current or voltage signals of all of the capacitor units of the group are transmitted to the group monitoring unit which is associated with this group and are further processed there. Further processing of the measurement values takes place in the processing unit. The mean values are formed, the ratios are formed and the changes in the ratios with respect to time are monitored in this processing unit. On the basis of a sudden change in a ratio (on account of a current through a capacitor unit, which current suddenly becomes smaller), it is identified that a capacitor element of the capacitor unit has failed. The wireless transmission unit then sends the result of the processing unit to the monitoring receiver at ground potential. Problems due to potential differences between the group monitoring unit and the monitoring receiver are avoided owing to the wireless transmission of the data.

When a capacitor element without a fuse is short-circuited on account of a failure, all of the capacitor elements which are connected in parallel to this capacitor element are short-circuited at the same time, so that the current through the respective capacitor unit increases greatly. Failures of this kind of capacitor units without a fuse can therefore be identified even more simply by means of the method and the arrangement.

A method and an arrangement in which voltage differences or current differences are ascertained and evaluated have been described. The voltage and/or current differences can be ascertained in an analogous manner by means of a permanently wired measurement circuit. The voltage differences or current differences are evaluated in a group monitoring unit which is associated with the respective group of capacitor units. If a rapid change in the ascertained current or voltage ratios with respect to time is established, it is then identified that a capacitor element in the respective capacitor unit has failed. In this case, data containing information about the affected capacitor unit is transmitted from the group monitoring unit (for example by radio signal or by optical waveguide) to a monitoring receiver which is at ground potential.

The described method evaluates current differences in the case of the parallel circuit of capacitor units and evaluates voltage differences in the case of the series circuit of capacitor units. The ratio of a current difference and the mean value of the current differences or the ratio of a voltage difference and the mean value of the voltage differences is formed in each case. As a result, the absolute value of current or voltage is irrelevant and the accuracy of the measurement is considerably increased.

The probability of the capacitor elements failing in several capacitor units of a group at the same time and as a result characteristic voltage or current differences not being produced is very low and can be ignored. Slow changes in the ascertained ratio (that is to say those which are smaller than the first threshold value or the second threshold value) can also occur without failure of a capacitor element, for example by slow temperature drift on account of solar irradiation or thermal heating of the capacitor bank. The failure of a capacitor element is not identified on account of slow changes of this kind in the ratio with respect to time. Slow changes of this kind can be compensated for by the evaluation circuit.

The described method and the described arrangement have a range of advantages:
it is not necessary to perform measurements at each individual capacitor element of a capacitor unit (that is to say measurements within the housing of a capacitor unit). Therefore, it is not necessary to determine the separate individual currents flowing through the capacitor elements (or the individual voltages occurring at the capacitor elements). Complicated and therefore expensive measurements of this kind are avoided. Specifically, it is sufficient when the currents or voltages of the capacitor units are ascertained outside the capacitor units (at the connections of the capacitor units). The currents or voltages are preferably measured with reference to the electrical potential of the individual levels of the capacitor bank (rack potential).

No costly high-precision measurements are required because a comparatively large change in the ratio with respect to time occurs on account of the formation of the ratio of the current or voltage difference and the mean value in the event of a failure in even only one individual capacitor element. Therefore, the group monitoring units and the current and voltage sensors can be realized in a relatively simple and robust manner. Therefore, this is advantageous in particular because the group monitoring units and the current and voltage sensors at a high voltage level are arranged on the individual levels of the capacitor bank.

Particularly in the case of capacitor units which are connected in parallel and have capacitor elements with a fuse, it would be possible only with great difficulty to identify a failure of a single capacitor element by current measurement, voltage measurement or capacitance measurement. Therefore, in the case of the described method, current differences between the currents flowing through the capacitor units are ascertained and these current differences are placed in a ratio with a mean current difference. As a result, the required measurement range is considerably smaller. In other words, the failure of even only one capacitor element leads to a considerable change in the ratio of the current difference and the mean value of the current differences with respect to time. As an example, the failure of a single capacitor element can lead to the capacitance of the capacitor unit and therefore the current flowing through the capacitor unit being slightly reduced, for example by 1.5%. This small change in the current would be relatively difficult to determine by measurement, in particular under the adverse conditions of an industrial high-voltage installation. However, in the case of the described method, measurement with much less accuracy is sufficient in order to identify the failure of a single capacitor element (on account of determining the current differences and the ratio). This effect can be referred to as a magnifying glass effect in measurements. This effect occurs because it is not the absolute values of current and voltage that are evaluated, but rather difference values are placed in a ratio with one another.

The magnitude of the change in the ratio with respect to time can even be used to identify whether one capacitor element has failed or whether two or more capacitor elements in one capacitor unit have failed at the same time. However, the failure of two or more capacitor elements in one capacitor unit at the same time is highly unlikely.

The results of the described method and of the arrangement (that is to say the findings about failed capacitor elements) can optionally be checked by way of comparison with results of conventional monitoring of the capacitor bank. Therefore, the plausibility of the results can be checked.

In some cases, the fuse in the case of a capacitor element which is provided with a fuse may not completely blow, but rather periodic flashovers may occur across the partially blown fuse. The resulting periodic change in the current or in the voltage can optionally likewise be identified by the respective group monitoring unit. Therefore, it can be identified that the respective capacitor element is defective in this case too.

The invention claimed is:

1. A method for monitoring a capacitor bank, the method comprising:
providing the capacitor bank with a plurality of capacitor units each having a plurality of electrical capacitor elements, wherein the capacitor units are subdivided into several groups of capacitor units;

providing each of the several groups of capacitor units with a respective group monitoring unit of a plurality of group monitoring units, and the respective group monitoring unit being permanently connected to each of the groups of capacitor units;

monitoring each group of capacitor units for a failure of a capacitor element in one of the capacitor units of the respective group by way of the associated group monitoring unit;

when a failure of a capacitor element is identified, transmitting data that describes the failure of the capacitor element from the group monitoring unit to a monitoring receiver; and provided that the capacitor units of a group are arranged electrically in a parallel circuit:
  ascertaining a current difference between a current flowing through a capacitor unit and a current flowing through the capacitor units on average for each of the capacitor units of the parallel circuit;
  ascertaining a mean value of the current differences of the capacitor units;
  forming a ratio of the current difference and the mean value for each of the capacitor units;
  monitoring a change in the ratio with respect to time; and
  identifying an occurrence of a defective capacitor element in the respective capacitor unit when the change in the ratio with respect to time exceeds a predetermined first threshold value; and/or provided that the capacitor units of a group are arranged electrically in a series circuit;
  ascertaining a capacitor unit voltage across each of the capacitor units;
  ascertaining a voltage difference between the capacitor unit voltages and an average capacitor unit voltage of each of the capacitor units of the series circuit;
  ascertaining a mean value of the voltage differences;
  forming a ratio of the respective voltage difference and the mean value for the capacitor units;
  monitoring a change in the ratio with respect to time; and
  identifying an occurrence of a defective capacitor element in the respective capacitor unit when the change in the ratio with respect to time exceeds a predetermined second threshold value.

2. The method according to claim 1, which comprises transmitting the data about the capacitor unit containing the failed capacitor element from the group monitoring unit to the monitoring receiver.

3. The method according to claim 1, wherein the capacitor elements in the capacitor units are connected electrically in parallel and/or in series.

4. The method according to claim 1, wherein each of the capacitor units has a housing, which surrounds all of the capacitor elements of the respective capacitor unit.

5. The method according to claim 1, wherein the capacitor units of the capacitor bank are arranged in at least one electrical series circuit and/or in at least one electrical parallel circuit.

6. The method according to claim 1, which comprises connecting the group monitoring units substantially at an electrical potential of the group of capacitor units associated therewith, and wherein the monitoring receiver is substantially at ground potential.

7. The method according to claim 1, which comprises supplying the group monitoring units with electrical power that is coupled out from the group of capacitor units associated with the respective group monitoring unit.

8. The method according to claim 7, which comprises providing a current transformer and coupling the electrical power out from a magnetic field that is formed on account of an electric current flowing through the group of capacitor units.

9. The method according to claim 1, which comprises providing the capacitor bank with a plurality of levels that are electrically insulated from one another and that each has at least one of the groups of capacitor units and the associated group monitoring unit arranged thereon.

10. The method according to claim 1, which comprises ascertaining the electrical voltage in each case at a connection of the capacitor units by way of a current signal which is respectively fed out from the capacitor units and is proportional to the electrical voltage at the connection of the respective capacitor unit and which is converted into a voltage signal outside the capacitor unit.

11. A method for monitoring a capacitor bank, the method comprising:

providing the capacitor bank with a plurality of capacitor units each having a plurality of electrical capacitor elements, wherein the capacitor units are subdivided into several groups of capacitor units;

providing each of the several groups of capacitor units with a respective group monitoring unit of a plurality of group monitoring units that is associated with and permanently connected to each of the groups of capacitor units;

monitoring each group of capacitor units for a failure of a capacitor element in one of the capacitor units of the respective group by way of the associated group monitoring unit;

when a failure of a capacitor element is identified, transmitting data about a failure of the capacitor element from the group monitoring unit to the monitoring receiver by way of a radio signal and/or by way of an optical waveguide; and provided that the capacitor units of a group are arranged electrically in a parallel circuit:
  ascertaining a current difference between a current flowing through a capacitor unit and a current flowing through the capacitor units on average for each of the capacitor units of the parallel circuit;
  ascertaining a mean value of the current differences of the capacitor units;
  forming a ratio of the current difference and the mean value for each of the capacitor units;
  monitoring a change in the ratio with respect to time; and
  identifying an occurrence of a defective capacitor element in the respective capacitor unit when the change in the ratio with respect to time exceeds a predetermined first threshold value; and/or provided that the capacitor units of a group are arranged electrically in a series circuit:
  ascertaining a capacitor unit voltage across each of the capacitor units;
  ascertaining a voltage difference between the capacitor unit voltages and an average capacitor unit voltage of each of the capacitor units of the series circuit;
  ascertaining a mean value of the voltage differences;
  forming a ratio of the respective voltage difference and the mean value for the capacitor units;

monitoring a change in the ratio with respect to time; and identifying an occurrence of a defective capacitor element in the respective capacitor unit when the change in the ratio with respect to time exceeds a predetermined second threshold value.

12. An arrangement, comprising:

a capacitor bank having a plurality of capacitor units each having a plurality of electrical capacitor elements, and each of said capacitor units being subdivided into a plurality of groups of capacitor units; and a plurality of group monitoring units, with one of said group monitoring units being permanently connected to each of said groups of capacitor units, and with at least one of said group monitoring units being configured to monitor a respective said group of capacitor units for a failure of a capacitor element in one of said capacitor units of the respective said group;

wherein, when a failure of a respective said capacitor element is identified, data which describes the failure of the respective said capacitor element is transmitted from the respectively associated group monitoring unit to a monitoring receiver; and with a proviso that said capacitor units of a group are arranged electrically in a parallel circuit, at least one of said group monitoring units is configured for:
  ascertaining a current difference between a current flowing through a capacitor unit and a current flowing through said capacitor units on average for each of said capacitor units of said parallel circuit;
  ascertaining a mean value of the current differences of said capacitor units;
  forming a ratio of the current difference and the mean value for each of said capacitor units;
  monitoring a change in the ratio with respect to time; and
  identifying an occurrence of a defective capacitor element in the respective said capacitor unit when the change in the ratio with respect to time exceeds a predetermined first threshold value; and/or with a proviso that said capacitor units of a group are arranged electrically in a series circuit, at least one of said group monitoring units is configured for:
  ascertaining a capacitor unit voltage across each of said capacitor units;
  ascertaining a voltage difference between said capacitor unit voltages and an average capacitor unit voltage of each of said capacitor units of said series circuit;
  ascertaining a mean value of the voltage differences;
  forming a ratio of the respective voltage difference and the mean value for said capacitor units;
  monitoring a change in the ratio with respect to time; and
  identifying an occurrence of a defective capacitor element in the respective said capacitor unit when the change in the ratio with respect to time exceeds a predetermined second threshold value.

13. The arrangement according to claim 12, wherein said capacitor elements in said capacitor units are connected electrically in parallel and/or in series.

14. The arrangement according to claim 12, wherein each of said capacitor units has a housing, which surrounds all of said capacitor elements of the respective said capacitor unit.

15. The arrangement according to claim 12, wherein said capacitor units of said capacitor bank are arranged in at least one electrical series circuit and/or in at least one electrical parallel circuit.

16. The arrangement according to claim 12, wherein said group monitoring units are each substantially at an electrical potential of the respective said group of capacitor units associated therewith and said monitoring receiver is substantially at ground potential.

17. The arrangement according to claim 12, which comprises a power supply device associated with at least one of said group monitoring units, said power supply device coupling out electrical power for supplying said at least one group monitoring unit from said group of capacitor units with which said at least one group monitoring unit is associated.

18. The arrangement according to claim 17, wherein said power supply device is a current transformer that couples out the electrical power from a magnetic field that is formed on account of an electric current flowing through said group of capacitor units.

19. The arrangement according to claim 12, wherein:
  at least one group monitoring unit has a wireless transmission unit which transmits the data about the failure of the capacitor element to the monitoring receiver by way of a radio signal; and/or
  at least one group monitoring unit is connected to said monitoring receiver by way of an optical waveguide in order to transmit the data about the failure of the capacitor element to the monitoring receiver via said optical waveguide.

20. The arrangement according to claim 12, wherein said capacitor bank has several levels which are electrically insulated from one another and on each of which at least one of said groups of capacitor units and the associated said group monitoring unit are arranged.

21. The arrangement according to claim 12, wherein each of said capacitor units is provided with a current path which leaves the respective said capacitor unit and is configured for feeding out a current signal, which is proportional to the voltage at a connection of the respective said capacitor unit, from the respective said capacitor unit.

* * * * *